United States Patent
Dyer

(10) Patent No.: US 12,308,826 B2
(45) Date of Patent: May 20, 2025

(54) BANDPASS FILTERS USING TRANSVERSELY-EXCITED FILM BULK ACOUSTIC RESONATORS

(71) Applicant: Murata Manufacturing Co., Ltd., Nagaokakyo (JP)

(72) Inventor: Greg Dyer, Santa Barbara, CA (US)

(73) Assignee: Murata Manufacturing Co., Ltd., Nagaokakyo (JP)

(*) Notice: Subject to any disclaimer, the term of this patent is extended or adjusted under 35 U.S.C. 154(b) by 330 days.

(21) Appl. No.: 17/407,186

(22) Filed: Aug. 20, 2021

(65) Prior Publication Data

US 2022/0247382 A1    Aug. 4, 2022

Related U.S. Application Data

(60) Provisional application No. 63/144,978, filed on Feb. 3, 2021.

(51) Int. Cl.
| | |
|---|---|
| *H03H 9/54* | (2006.01) |
| *H03H 9/205* | (2006.01) |
| *H03H 9/56* | (2006.01) |

(52) U.S. Cl.
CPC ............ *H03H 9/542* (2013.01); *H03H 9/205* (2013.01); *H03H 9/568* (2013.01)

(58) Field of Classification Search
None
See application file for complete search history.

(56) References Cited

U.S. PATENT DOCUMENTS

| | | |
|---|---|---|
| 5,446,330 A | 8/1995 | Eda et al. |
| 5,552,655 A | 9/1996 | Stokes et al. |
| 5,726,610 A | 3/1998 | Allen et al. |
| 5,853,601 A | 12/1998 | Krishaswamy |
| 6,377,140 B1 | 4/2002 | Ehara et al. |
| 6,516,503 B1 | 2/2003 | Ikada et al. |
| 6,540,827 B1 | 4/2003 | Levy et al. |

(Continued)

FOREIGN PATENT DOCUMENTS

| | | |
|---|---|---|
| WO | 2016017104 | 2/2016 |
| WO | 2018003273 | 1/2018 |

OTHER PUBLICATIONS

Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) Jan. 00, 2015.

(Continued)

*Primary Examiner* — Kenneth B Wells
(74) *Attorney, Agent, or Firm* — ArentFox Schiff LLP

(57) ABSTRACT

Bandpass filters for a target communications band extending between a lower band edge and an upper band edge are disclosed. A bandpass filter includes one or more shunt resonators and one or more series resonators connected in a ladder filter circuit, wherein a relative difference between the anti-resonance and resonance frequencies of each acoustic resonator is greater than a fractional bandwidth of the target communications band. A first capacitor is connected in parallel with a first shunt resonator from the one or more shunt resonators, and a second capacitor connected in parallel with a first series resonator from the one or more series resonators.

15 Claims, 8 Drawing Sheets

(56) References Cited

U.S. PATENT DOCUMENTS

| | | | |
|---|---|---|---|
| 6,707,229 B1 | 3/2004 | Martin | |
| 6,710,514 B2 | 3/2004 | Ikada et al. | |
| 7,135,940 B2* | 11/2006 | Kawakubo | H03J 3/08 |
| | | | 333/17.1 |
| 7,345,400 B2 | 3/2008 | Nakao et al. | |
| 7,463,118 B2 | 12/2008 | Jacobsen | |
| 7,535,152 B2 | 5/2009 | Ogami et al. | |
| 7,684,109 B2 | 3/2010 | Godshalk et al. | |
| 7,688,161 B2* | 3/2010 | Miura | H03H 9/6483 |
| | | | 333/195 |
| 7,728,483 B2 | 6/2010 | Tanaka | |
| 7,868,519 B2 | 1/2011 | Umeda | |
| 7,941,103 B2 | 5/2011 | Iwamoto et al. | |
| 7,965,015 B2 | 6/2011 | Tai et al. | |
| 8,278,802 B1 | 10/2012 | Lee et al. | |
| 8,294,330 B1 | 10/2012 | Abbott et al. | |
| 8,344,815 B2 | 1/2013 | Yamanaka et al. | |
| 8,816,567 B2 | 8/2014 | Zuo et al. | |
| 8,829,766 B2 | 9/2014 | Milyutin et al. | |
| 8,932,686 B2 | 1/2015 | Hayakawa et al. | |
| 9,093,979 B2 | 7/2015 | Wang | |
| 9,112,134 B2 | 8/2015 | Takahashi | |
| 9,130,145 B2 | 9/2015 | Martin et al. | |
| 9,219,466 B2 | 12/2015 | Meltaus et al. | |
| 9,276,557 B1 | 3/2016 | Nordquist et al. | |
| 9,369,105 B1 | 6/2016 | Li et al. | |
| 9,425,765 B2 | 8/2016 | Rinaldi | |
| 9,525,398 B1 | 12/2016 | Olsson | |
| 9,607,119 B1* | 3/2017 | McHugh | G06F 30/398 |
| 9,640,750 B2 | 5/2017 | Nakanishi et al. | |
| 9,748,923 B2 | 8/2017 | Kando et al. | |
| 9,762,202 B2 | 9/2017 | Thalmayr et al. | |
| 9,780,759 B2 | 10/2017 | Kimura et al. | |
| 9,837,984 B2 | 12/2017 | Khlat et al. | |
| 10,050,601 B2* | 8/2018 | Murase | H03H 9/15 |
| 10,079,414 B2 | 9/2018 | Guyette et al. | |
| 10,187,039 B2 | 1/2019 | Komatsu et al. | |
| 10,200,013 B2 | 2/2019 | Bower et al. | |
| 10,211,806 B2 | 2/2019 | Bhattacharjee | |
| 10,284,176 B1 | 5/2019 | Solal | |
| 10,305,447 B2* | 5/2019 | Raihn | H03H 9/6483 |
| 10,491,192 B1 | 11/2019 | Plesski et al. | |
| 10,601,392 B2 | 3/2020 | Plesski et al. | |
| 10,637,438 B2 | 4/2020 | Garcia et al. | |
| 10,644,674 B2 | 5/2020 | Takamine | |
| 10,756,697 B2 | 8/2020 | Plesski et al. | |
| 10,790,802 B2 | 9/2020 | Yantchev et al. | |
| 10,797,675 B2 | 10/2020 | Plesski | |
| 10,819,309 B1 | 10/2020 | Turner et al. | |
| 10,826,462 B2 | 11/2020 | Plesski et al. | |
| 10,868,510 B2 | 12/2020 | Yantchev et al. | |
| 10,868,512 B2 | 12/2020 | Garcia et al. | |
| 10,868,513 B2 | 12/2020 | Yantchev | |
| 10,911,017 B2 | 2/2021 | Plesski | |
| 10,911,021 B2 | 2/2021 | Turner et al. | |
| 10,911,023 B2 | 2/2021 | Turner | |
| 10,917,070 B2 | 2/2021 | Plesski et al. | |
| 10,917,072 B2 | 2/2021 | McHugh et al. | |
| 10,985,726 B2 | 4/2021 | Plesski | |
| 10,985,728 B2 | 4/2021 | Plesski et al. | |
| 10,985,730 B2 | 4/2021 | Garcia | |
| 10,992,282 B1 | 4/2021 | Plesski et al. | |
| 10,992,283 B2 | 4/2021 | Plesski et al. | |
| 10,992,284 B2 | 4/2021 | Yantchev | |
| 10,998,877 B2 | 5/2021 | Turner et al. | |
| 10,998,882 B2 | 5/2021 | Yantchev et al. | |
| 11,003,971 B2 | 5/2021 | Plesski et al. | |
| 11,211,917 B2* | 12/2021 | Nosaka | H03H 9/25 |
| 11,563,423 B2* | 1/2023 | Komatsu | H03H 9/02102 |
| 2002/0079986 A1 | 6/2002 | Ruby et al. | |
| 2002/0158714 A1 | 10/2002 | Kaitila et al. | |
| 2002/0189062 A1 | 12/2002 | Lin et al. | |
| 2003/0080831 A1 | 5/2003 | Naumenko et al. | |
| 2003/0199105 A1 | 10/2003 | Kub et al. | |
| 2004/0100164 A1 | 5/2004 | Murata | |
| 2004/0261250 A1 | 12/2004 | Kadota et al. | |
| 2005/0185026 A1 | 8/2005 | Noguchi et al. | |
| 2005/0218488 A1 | 10/2005 | Matsuo | |
| 2005/0264136 A1 | 12/2005 | Tsutsumi et al. | |
| 2005/0280476 A1* | 12/2005 | Abe | H03L 7/0805 |
| | | | 331/17 |
| 2006/0179642 A1 | 8/2006 | Kawamura | |
| 2007/0182510 A1 | 8/2007 | Park | |
| 2007/0188047 A1 | 8/2007 | Tanaka | |
| 2007/0194863 A1 | 8/2007 | Shibata et al. | |
| 2007/0267942 A1 | 11/2007 | Matsumoto et al. | |
| 2008/0246559 A1 | 10/2008 | Ayazi | |
| 2010/0064492 A1 | 3/2010 | Tanaka | |
| 2010/0123367 A1 | 5/2010 | Tai et al. | |
| 2011/0018389 A1 | 1/2011 | Fukano et al. | |
| 2011/0018654 A1 | 1/2011 | Bradley et al. | |
| 2011/0109196 A1 | 5/2011 | Goto et al. | |
| 2011/0278993 A1 | 11/2011 | Iwamoto | |
| 2012/0286900 A1 | 11/2012 | Kadota et al. | |
| 2013/0234805 A1 | 9/2013 | Takahashi | |
| 2013/0271238 A1 | 10/2013 | Onda | |
| 2013/0278609 A1 | 10/2013 | Stephanou et al. | |
| 2013/0321100 A1 | 12/2013 | Wang | |
| 2014/0130319 A1 | 5/2014 | Iwamoto | |
| 2014/0145556 A1 | 5/2014 | Kadota | |
| 2014/0151151 A1 | 6/2014 | Reinhardt | |
| 2014/0152145 A1 | 6/2014 | Kando et al. | |
| 2014/0173862 A1 | 6/2014 | Kando et al. | |
| 2014/0225684 A1 | 8/2014 | Kando et al. | |
| 2015/0042417 A1 | 2/2015 | Onodera et al. | |
| 2015/0319537 A1 | 11/2015 | Perois et al. | |
| 2015/0333730 A1 | 11/2015 | Meltaus et al. | |
| 2016/0028367 A1 | 1/2016 | Shealy | |
| 2016/0182009 A1 | 6/2016 | Bhattacharjee | |
| 2017/0063332 A1 | 3/2017 | Gilbert et al. | |
| 2017/0179225 A1 | 6/2017 | Kishimoto | |
| 2017/0179928 A1 | 6/2017 | Raihn et al. | |
| 2017/0214381 A1 | 7/2017 | Bhattacharjee | |
| 2017/0214382 A1 | 7/2017 | Burak et al. | |
| 2017/0222617 A1 | 8/2017 | Mizoguchi | |
| 2017/0222622 A1 | 8/2017 | Solal et al. | |
| 2017/0370791 A1 | 12/2017 | Nakamura et al. | |
| 2018/0005950 A1 | 1/2018 | Watanabe | |
| 2018/0026603 A1 | 1/2018 | Iwamoto | |
| 2018/0033952 A1 | 2/2018 | Yamamoto | |
| 2018/0062615 A1 | 3/2018 | Kato et al. | |
| 2018/0062617 A1 | 3/2018 | Yun et al. | |
| 2018/0123016 A1 | 5/2018 | Gong | |
| 2018/0191322 A1 | 7/2018 | Chang et al. | |
| 2019/0068164 A1 | 2/2019 | Houlden et al. | |
| 2019/0123721 A1 | 4/2019 | Takamine | |
| 2019/0131953 A1 | 5/2019 | Gong | |
| 2019/0273480 A1 | 9/2019 | Lin et al. | |
| 2019/0348966 A1 | 11/2019 | Campanella-Pineda | |
| 2020/0036357 A1 | 1/2020 | Mimura | |
| 2020/0220522 A1* | 7/2020 | Nosaka | H03H 9/605 |
| 2020/0235719 A1 | 7/2020 | Yantchev et al. | |
| 2020/0235720 A1* | 7/2020 | Nosaka | H03H 9/6406 |
| 2022/0158624 A1* | 5/2022 | Hsiao | H03H 9/542 |

OTHER PUBLICATIONS

Zou, Jie "High-Performance Aluminum Nitride Lamb Wave Resonators for RF Front-End Technology" University of California, Berkeley, Summer 2015, pp. 63 (Year 2015) Jan. 00, 2015.

Santosh, G. , Surface acoustic wave devices on silicon using patterned and thin film ZnO, Ph.D. thesis, Feb. 2016, Indian Institute of technology Guwahati, Assam, India Feb. 2016.

Merriam Webster, dictionary meaning of the word "diaphragm", since 1828, Merriam Webster (Year: 1828) 1828.

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

Safari et al. "Piezoelectric for Transducer Applications" published by Elsevier Science Ltd., pp. 4 (Year: 2000). 2020.

Moussa et al. Review on Triggered Liposomal Drug Delivery with a Focus on Ultrasound 2015, Bentham Science Publishers, pp. 16 (Year 2005) 2005.

(56) References Cited

OTHER PUBLICATIONS

Acoustic Properties of Solids ONDA Corporation 592 Weddell Drive, Sunnyvale, CA 94089, Apr. 11, 2003, pp. 5 (Year 2003). 2003.
Bahreyni, B. Fabrication and Design of Resonant Microdevices Andrew William, Inc. 2018, NY (Year 2008). 2008.
Material Properties of Tibtech Innovations, © 2018 TIBTECH Innovations (Year 2018). 2018.
USPTO/ISA, International Search Report and Written Opinion for PCT Application No. PCT/US2020/45654 dated Oct. 29, 2020.
T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.
M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.
Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.
Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.
USPTO/ISA, International Search Report and Written Opinion for PCT Application No. PCT/US2019/036433 dated Aug. 29, 2019.
USPTO/ISA, International Search Report and Written Opinion for PCT Application No. PCT/US2019/058632 dated Jan. 17, 2020.
G. Manohar, "Investigation of Various Surface Acoustic Wave Design Configurations for Improved Sensitivity." Doctoral dissertation, University of South Florida, USA, Jan. 2012, 7 pages.
Ekeom, D. & Dubus, Bertrand & Volatier, A . . . (2006). Solidly mounted resonator (SMR) FEM-BEM simulation. 1474-1477. 10.1109/ULTSYM.2006.371.
Mizutaui, K. and Toda, K., "Analysis of lamb wave propagation characteristics in rotated Ycut Xpropagation LiNbO3 plates." Electron. Comm. Jpn. Pt. 1, 69, No. 4 (1986): 47-55. doi:10.1002/ecja.4410690406.
Naumenko et al., "Optimal orientations of Lithium Niobate for resonator SAW filters", 2003 IEEE Ultrasonics Symposium—pp. 2110-2113. (Year: 2003).
Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.
Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.
A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.
Buchanan "Ceramic Materials for Electronics" 3rd Edition, first published in 2004 by Marcel Dekker, Inc. pp. 496 (Year 2004). Jan. 00, 2004.
Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.
Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

* cited by examiner

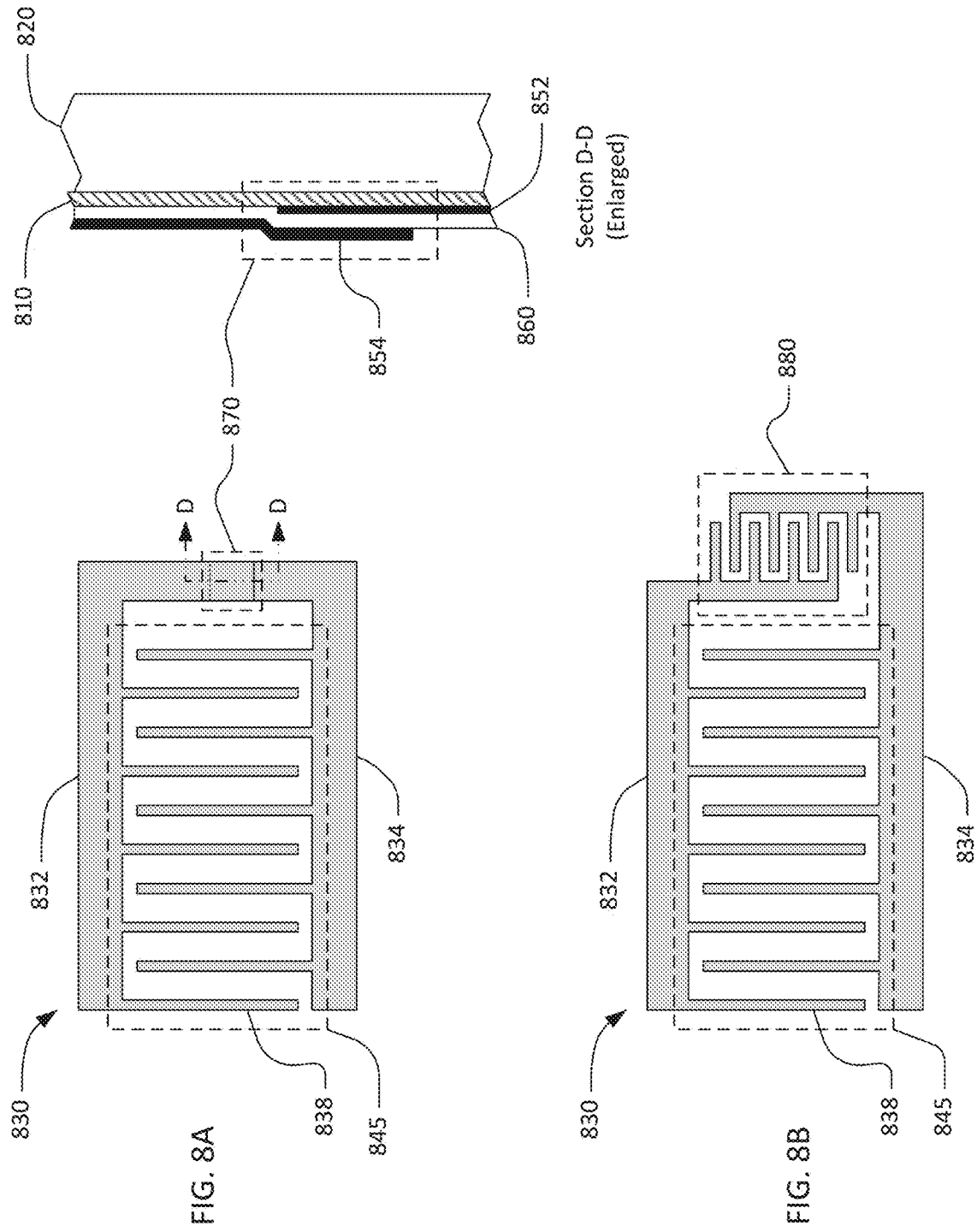

BANDPASS FILTERS USING TRANSVERSELY-EXCITED FILM BULK ACOUSTIC RESONATORS

RELATED APPLICATION INFORMATION

This patent claim priority to provisional patent application No. 63/144,978, filed Feb. 3, 2021, entitled XBAR WITH PARALLEL CAPACITANCE TO REDUCE EFFECTIVE COUPLING, which is incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP (3rd Generation Partnership Project). Radio access technology for 5th generation (5G) mobile networks is defined in the 5G NR (new radio) standard. The 5G NR standard defines several new communications bands. Two of these new communications bands are n77, which uses the frequency range from 3300 MHz to 4200 MHZ, and n79, which uses the frequency range from 4400 MHz to 5000 MHz. Both band n77 and band n79 use time-division duplexing (TDD), such that a communications device operating in band n77 and/or band n79 uses the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

DESCRIPTION OF THE DRAWINGS

FIG. 8A is a schematic plan view and a cross-sectional detail view of an XBAR and a metal-insulator-metal (MIM) capacitor connected in parallel.

FIG. 8B is a schematic plan view of an XBAR and an interdigitated capacitor connected in parallel.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
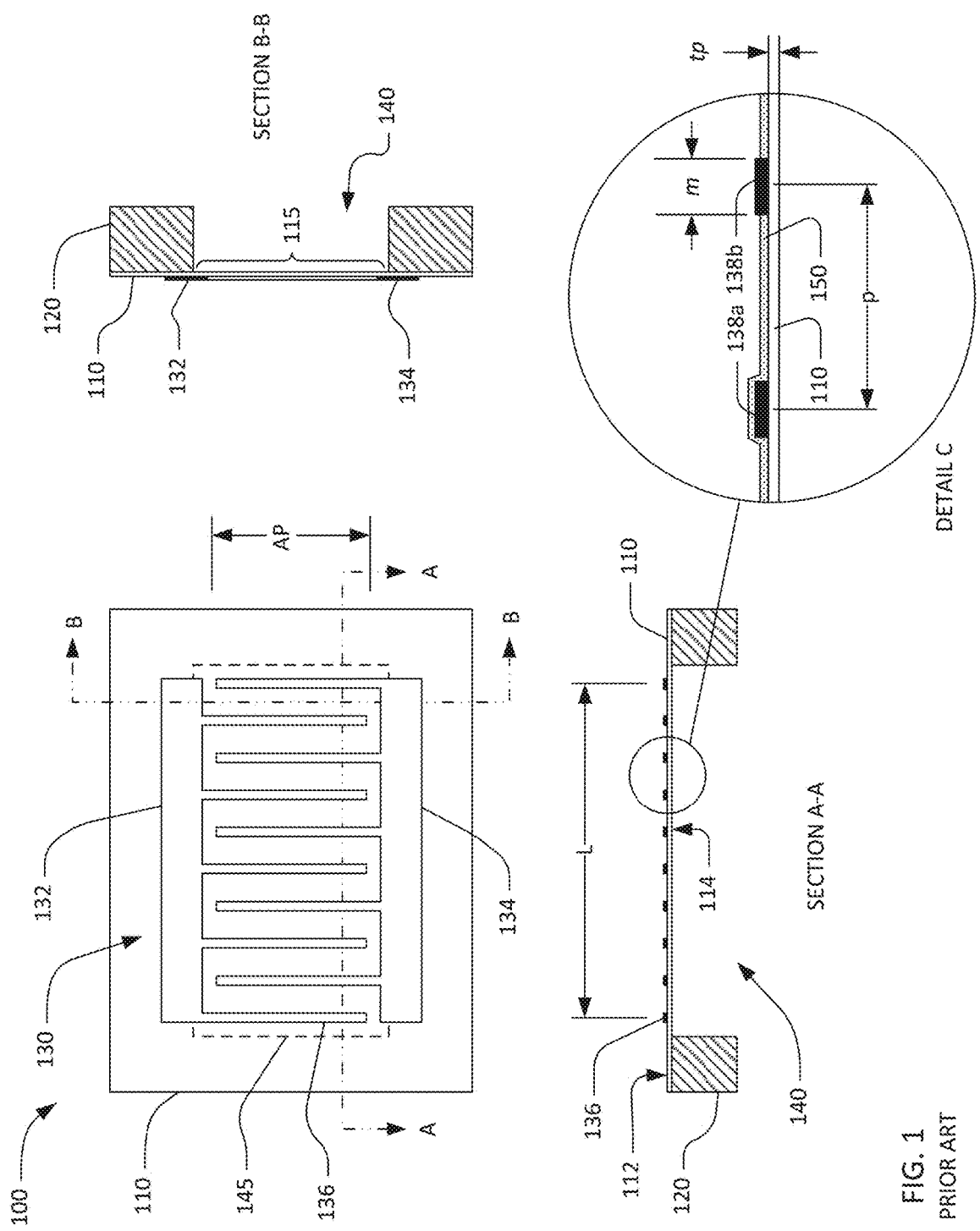
FIG. 1 includes a schematic plan view, two schematic cross-sectional views, and a detail view of a transversely-excited film bulk acoustic resonator (XBAR).

FIG. 1 shows a simplified schematic top view and orthogonal cross-sectional views of an XBAR 100. XBAR-type resonators such as the XBAR 100 may be used in a variety of RF filters including band-reject filters, band-pass filters, duplexers, and multiplexers.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be Z-cut, which is to say the Z axis is normal to the front and back surfaces 112, 114. The piezoelectric plate may be rotated Z-cut or rotated YX-cut. XBARs may be fabricated on piezoelectric plates with other crystallographic orientations.

The back surface 114 of the piezoelectric plate 110 is attached to a surface of a substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate around at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be attached to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1).

"Cavity" has its conventional meaning of "an empty space within a solid body." The cavity 140 may be a hole completely through the substrate 120 (as shown in Section A-A and Section B-B) or a recess in the substrate 120 under the diaphragm 115. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The term "busbar" means a conductor from which the fingers of an IDT extend. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. The primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may have more or fewer than four sides, which may be straight or curved.

For ease of presentation in FIG. 1, the geometric pitch and width of the IDT fingers are greatly exaggerated with respect to the length (dimension L) and aperture (dimension AP) of the XBAR. A typical XBAR has more than ten parallel fingers in the IDT 130. An XBAR may have hundreds, possibly thousands, of parallel fingers in the IDT 130. Similarly, the thicknesses of the IDT fingers and the piezoelectric plate in the cross-sectional views are greatly exaggerated.

Referring now to the detailed schematic cross-sectional view (Detail C), a front-side dielectric layer 150 may optionally be formed on the front side of the piezoelectric plate 110. The "front side" of the XBAR is, by definition, the surface facing away from the substrate. The front-side dielectric layer 150 may be formed only between the IDT fingers (e.g. IDT finger 138b) or may be deposited as a blanket layer such that the dielectric layer is formed both between and over the IDT fingers (e.g. IDT finger 138a). The front-side dielectric layer 150 may be a non-piezoelectric dielectric material, such as silicon dioxide, alumina, or silicon nitride. A thickness of the front side dielectric layer 150 is typically less than about one-third of the thickness tp of the piezoelectric plate 110. The front-side dielectric layer 150 may be formed of multiple layers of two or more materials. In some applications, a back-side dielectric layer (not shown) may be formed on the back side of the piezoelectric plate 110.

The IDT fingers 138a, 138b may be one or more layers of aluminum, an aluminum alloy, copper, a copper alloy, beryllium, gold, tungsten, molybdenum, chromium, titanium or some other conductive material. The IDT fingers are considered to be "substantially aluminum" if they are formed from aluminum or an alloy comprising at least 50% aluminum. The IDT fingers are considered to be "substantially copper" if they are formed from copper or an alloy comprising at least 50% copper. Thin (relative to the total thickness of the conductors) layers of metals such as chromium or titanium may be formed under and/or over and/or as layers within the fingers to improve adhesion between the fingers and the piezoelectric plate 110 and/or to passivate or encapsulate the fingers and/or to improve power handling. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension m is the width or "mark" of the IDT fingers. The geometry of the IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT may be 2 to 20 times the width m of the fingers. The pitch p is typically 3.3 to 5 times the width m of the fingers. In addition, the pitch p of the IDT may be 2 to 20 times the thickness of the piezoelectric plate 210. The pitch p of the IDT is typically 5 to 12.5 times the thickness of the piezoelectric plate 210. The width m of the IDT fingers in an XBAR is not constrained to be near one-fourth of the acoustic wavelength at resonance. For example, the width of XBAR IDT fingers may be 500 nm or greater, such that the IDT can be readily fabricated using optical lithography. The thickness of the IDT fingers 138a, 138b may be from 100 nm to about equal to the width m. The thickness of the busbars (132, 134) of the IDT may be the same as, or greater than, the thickness of the IDT fingers.

An XBAR based on shear acoustic wave resonances can achieve better performance than current state-of-the art surface acoustic wave (SAW), film-bulk-acoustic-resonators (FBAR), and solidly-mounted-resonator bulk-acoustic-wave (SMR BAW) devices. In particular, the piezoelectric coupling for shear wave XBAR resonances can be high (>20%) compared to other acoustic resonators. High piezoelectric coupling enables the design and implementation of microwave and millimeter-wave filters of various types with appreciable bandwidth.

Figure 2A:
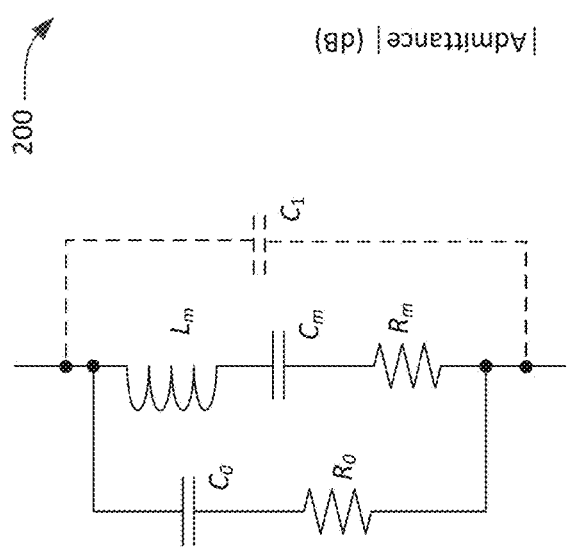
FIG. 2A is an equivalent circuit model of an acoustic resonator.

The basic behavior of acoustic resonators, including XBARs, is commonly described using the Butterworth Van Dyke (BVD) circuit model as shown in FIG. 2A. The BVD circuit model consists of a motional arm and a static arm. The motional arm includes a motional inductance $L_m$, a motional capacitance $C_m$, and a resistance $R_m$. The static arm includes a static capacitance $C_0$ and a resistance $R_0$. The dashed lines show an additional capacitor $C_1$ connected in parallel with the acoustic resonator. The capacitor $C_1$ is not part of the acoustic resonator but may be present in some applications, as will be discussed subsequently. While the BVD model does not fully describe the behavior of an acoustic resonator, it does a good job of modeling the two primary resonances that are used to design band-pass filters, duplexers, and multiplexers (multiplexers are filters with more than 2 input or output ports with multiple passbands).

The first primary resonance of the BVD model is the motional resonance caused by the series combination of the motional inductance $L_m$ and the motional capacitance $C_m$. The second primary resonance of the BVD model is the anti-resonance caused by the combination of the motional inductance $L_m$, the motional capacitance $C_m$, and the static capacitance $C_0$. In a lossless resonator ($R_m=R_0=0$), the frequency $F_r$ of the motional resonance is given by $$F_r = \frac{1}{2\pi\sqrt{L_m C_m}} \quad (1)$$

The frequency $F_a$ of the anti-resonance is given by $$F_a = F_r\sqrt{1 + \frac{1}{\gamma}} \quad (2)$$

where $\gamma=C_0/C_m$ is dependent on the resonator structure and the type and the orientation of the crystalline axes of the piezoelectric material.

Figure 2B:
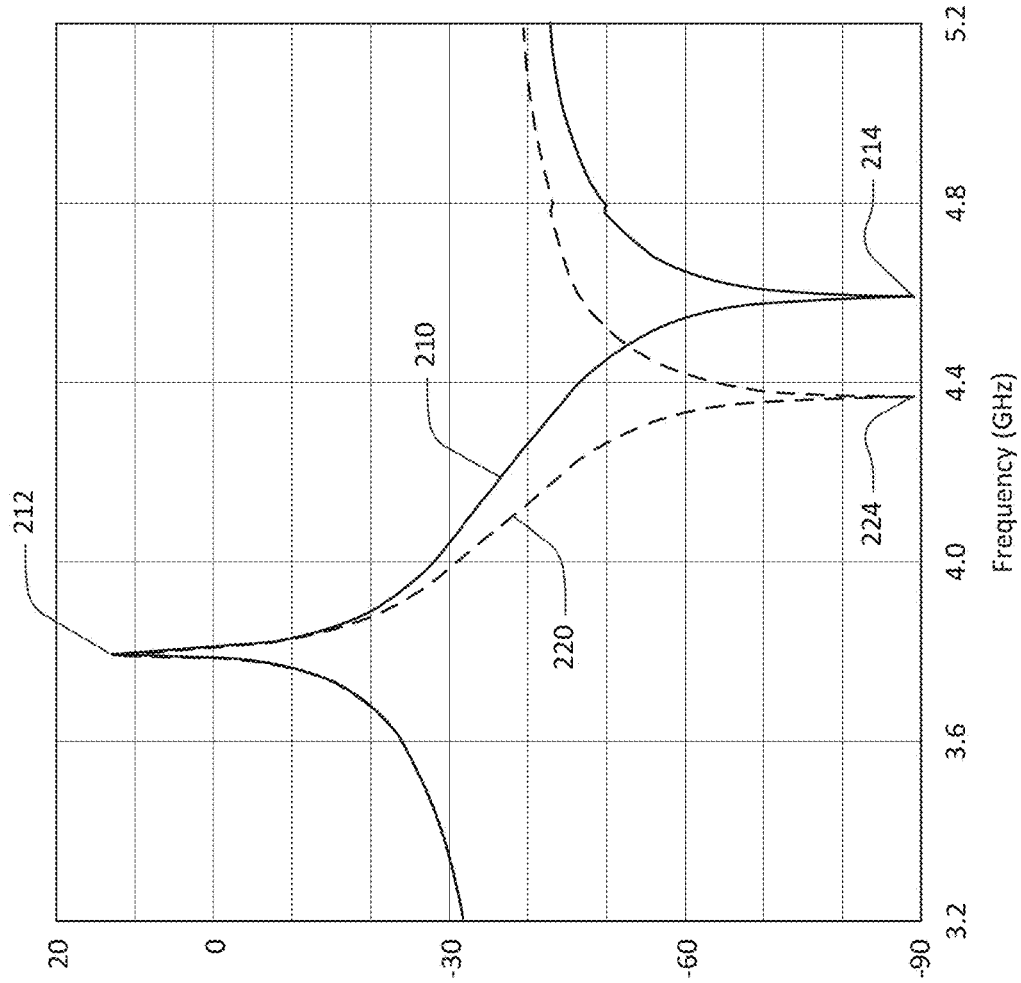
FIG. 2B is a graph of the magnitude of admittance of an ideal acoustic resonator.

FIG. 2B is a graph 200 of the performance of a theoretical lossless acoustic resonator. Specifically, the solid curve 210 is a plot of the magnitude of admittance of the acoustic resonator as a function of frequency. The acoustic resonator has a resonance 212 at a resonance frequency where the admittance of the resonator approaches infinity. The resonance is due to the series combination of the motional inductance $L_m$ and the motional capacitance $C_m$ in the BVD model of FIG. 2A. The acoustic resonator also exhibits an anti-resonance 214 where the admittance of the resonator approaches zero. The anti-resonance is caused by the combination of the motional inductance $L_m$, the motional capacitance $C_m$, and the static capacitance $C_0$. In a lossless resonator ($R_m=R_0=0$), the frequency $F_r$ of the resonance is given by $$F_r = \frac{1}{2\pi\sqrt{L_m C_m}} \quad (1)$$

The frequency $F_a$ of the anti-resonance is given by $$F_a = F_r\sqrt{1 + \frac{1}{\gamma}} \quad (2)$$

In over-simplified terms, the lossless acoustic resonator can be considered a short circuit at the resonance frequency 212 and an open circuit at the anti-resonance frequency 214. The resonance and anti-resonance frequencies in FIG. 2B are representative, and an acoustic resonator may be designed for other frequencies.

The dashed curve 220 is a plot of the magnitude of admittance of a circuit with an acoustic resonator having the admittance characteristic of the solid curve 210, in parallel with a capacitor such as the capacitor $C_1$ in FIG. 2A. The capacitor $C_1$ is, in effect, in parallel with the static capacitance $C_0$ of the resonator. The antiresonance 224 of the circuit occurs at a lower frequency than the anti-resonance frequency of the resonator alone. The reduction in anti-resonance frequency is determined by the capacitance of the capacitor $C_1$ relative to the static capacitance $C_0$ of the resonator.

Figure 2C:
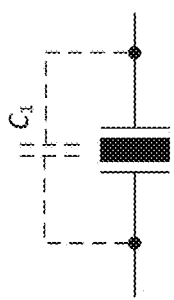
FIG. 2C is a circuit symbol for an acoustic resonator.

FIG. 2C shows the circuit symbol for an acoustic resonator such as an XBAR. This symbol will be used to designate each acoustic resonator in schematic diagrams of filters in subsequent figures. A parallel capacitor, such as capacitor $C_1$, is shown separately.

Figure 3:
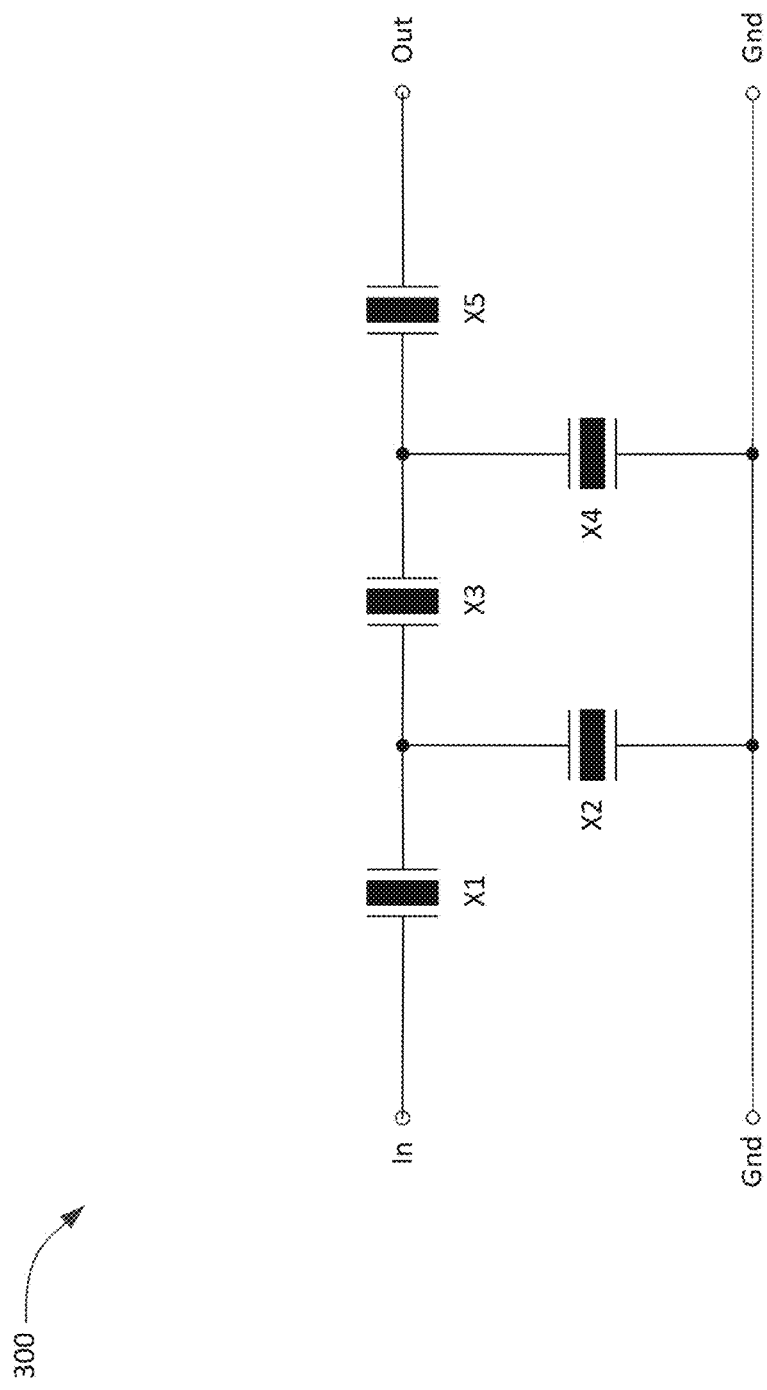
FIG. 3 is a schematic block diagram of a band-pass filter using acoustic resonators.

FIG. 3 is a schematic circuit diagram for a high frequency band-pass filter 300 using acoustic resonators such as XBARs. The filter 300 has a conventional ladder filter architecture including three series resonators X1, X3, X5 and two shunt resonators X2 and X4. The three series resonators X1, X3, X5 are connected in series between a first port and a second port (hence the term "series resonator"). In FIG. 3, the first and second ports are labeled "In" and "Out", respectively. However, the filter 300 is bidirectional and either port may serve as the input or output of the filter. The two shunt resonators X2, X4 are connected from nodes between the series resonators to ground. All the shunt resonators and series resonators may be XBARs.

The inclusion of three series and two shunt resonators in the filter 300 is exemplary. A filter may have more or fewer than five total resonators, more or fewer than three series resonators, and more or fewer than two shunt resonators. Typically, all of the series resonators are connected in series between an input and an output of the filter. All of the shunt resonators are typically connected between ground and one of the input, the output, or a node between two series resonators.

In the exemplary filter 300, the three series resonators X1, X3, X5 and the two shunt resonators X2, X4 may formed on a single plate of piezoelectric material bonded to a substrate (not visible). In some filters, the series resonators and shunt resonators may be formed on different plates of piezoelectric material. Each resonator includes a respective IDT (not shown), with at least the fingers of the IDT disposed over a cavity in the substrate. In this and similar contexts, the term "respective" means "relating things each to each", which is to say with a one-to-one correspondence.

Each of the resonators X1, X2, X3, X4, X5 in the filter 300 has resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 300. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators.

In a typical ladder filter circuit, shunt resonators provide transmission zeros below the lower edge of the passband. To this end, the resonance frequencies of the shunt resonators are positioned below the lower edge of the filter's passband and the anti-resonance frequencies of the shunt resonators are within the passband. Conversely, series resonators provide transmission zeros above the passband. The resonance frequencies of the series resonators are within the passband and the anti-resonance frequencies of the series resonators are positioned above the upper edge of the passband.

In some filters, a front-side dielectric layer (also called a "frequency setting layer"), such as the layer 150 in FIG. 1, may be formed on the shunt resonators to set the resonance frequencies of the shunt resonators lower relative to the resonance frequencies of the series resonators. In other filters, the diaphragms of series resonators may be thinner than the diaphragms of shunt resonators. In some filters, the series resonators and the shunt resonators may be fabricated on separate chips having different piezoelectric plate thicknesses.

Lithium niobate (LN) is a preferred piezoelectric material for use in XBARs. LN has very high electromechanical coupling and is available as thin plates attached to non-piezoelectric substrates. While a wide variety of crystal orientations can be used in an XBAR, two orientations that have been used are Z-cut (Euler angles 0°, 0°, 90°) and rotated Y-cut (Euler angles 0°, β, 0° where 0°<β≤70°). Rotated Y-cut LN with 28°≤β≤38° has higher electromechanical coupling than Z-cut LN. Further, while both Z-cut and rotated Y-cut LN XBARs are susceptible to spurious acoustic modes and leakage/loss of acoustic energy in the transverse direction (the direction parallel to the IDT fingers), comparatively simple structures can be used to minimize such losses in a rotated Y-cut LN XBAR. Minimizing acoustic losses in a Z-cut LN XBAR requires a more complex structure that necessitates additional fabrication steps. Additionally, rotated Y-cut LN XBARs may have fewer and smaller spurious modes than Z-cut XBARs. Thus rotated Y-cut LN is a preferred material for the piezoelectric plate in an XBAR.

Figure 4:
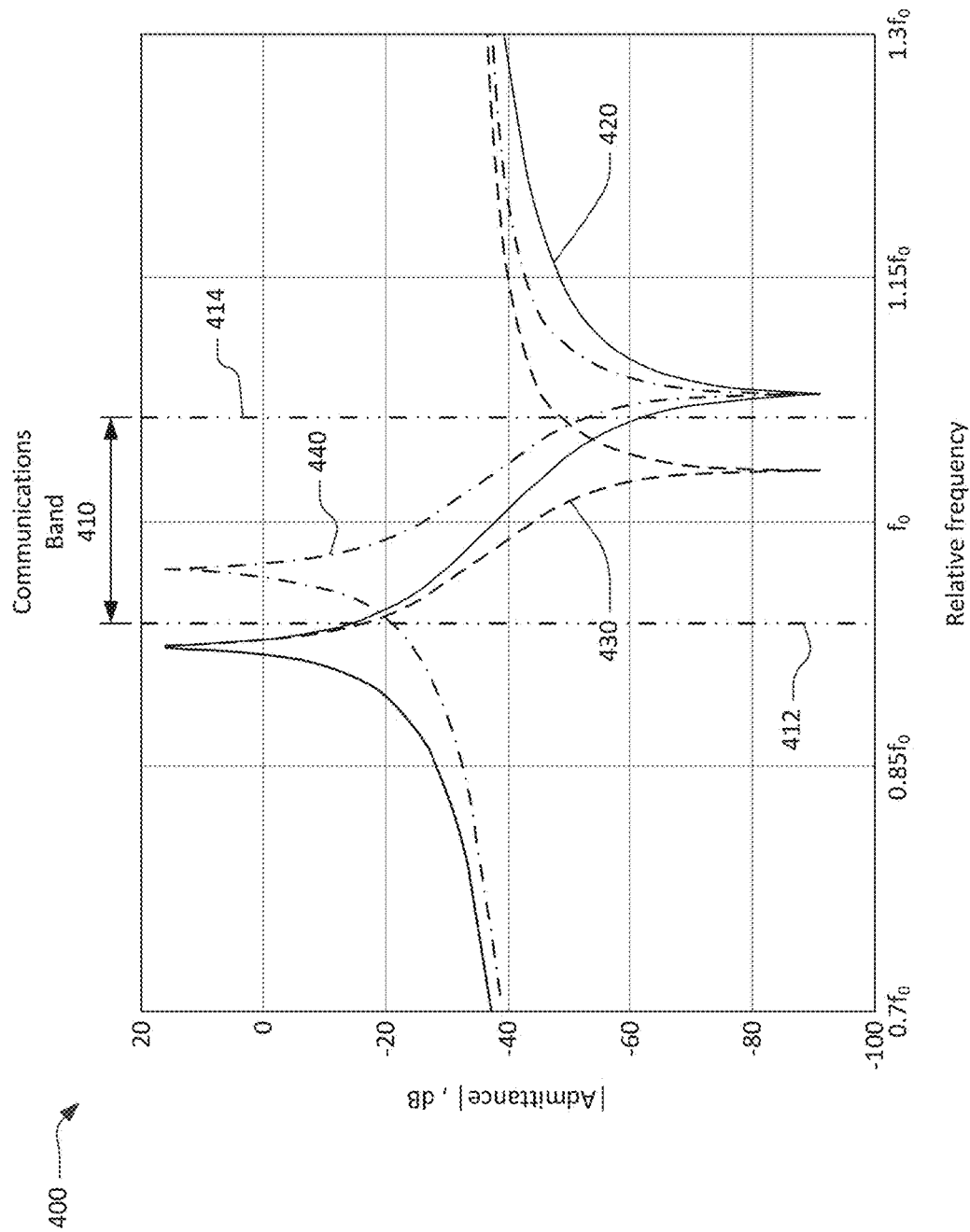
FIG. 4 is a chart showing the magnitude of admittance of acoustic resonators relative to a target communications band.

The large difference between the resonance and anti-resonance frequencies of rotated Y-cut LN XBARs enables the design of filters with very wide bandwidths. However, the difference between the resonance and anti-resonance frequencies of an XBAR can be too high for some filter applications, as illustrated in FIG. 4. In graph 400 of FIG. 4, the two dot-dot-dash lines 412, 414 represent the lower and upper band edges, respectively, of a communications band 410 with a fractional bandwidth of 12.5%. Fractional bandwidth is defined herein as the difference between the frequencies of the upper and lower band edges divided by the center frequency. An example of a communications band with a fractional bandwidth about 12.5% is 5G NR band n79, which extends from 4400 MHz to 5000 MHz (fractional bandwidth≈12.8%).

A bandpass filter for the target communications band requires transmission zeros below the lower band edge and above the upper band edge. In a typical ladder filter circuit, the transmission zeros below the lower band edge are provided by the resonances of shunt resonators in a ladder filter circuit. The dashed curve 430 is a plot of the magnitude of admittance for a hypothetical shunt resonator—the resonance frequency (where the admittance is highest) is just below the lower band edge 412 and the anti-resonance frequency (where the admittance is lowest) is within the communications band 410. The frequency offset between the resonances of the shunt resonators and the lower band edge 412 is determined by the Q-factor of the shunt resonators and allowances for temperature variations and manufacturing tolerances.

Similarly, the transmission zeros above the upper band edge 414 are provided by the anti-resonances of series resonators in the ladder filter circuit. The dot-dash curve 440 is a plot of the magnitude of admittance for a hypothetical series resonator—the anti-resonance frequency (where the admittance is lowest) is just above the upper band edge 414 and the resonance frequency (where the admittance is highest) is within the communications band 410. The frequency offset between the anti-resonances of the series resonators and the upper band edge 414 is determined by the Q-factor of the series resonators and allowances for temperature variations and manufacturing tolerances.

The solid curve 420 is a plot of the magnitude of the admittance of an ideal rotated Y-cut XBAR (i.e. an XBAR using a rotated Y-cut piezoelectric plate) with Euler angles 0°, 20°-40°, 0°. The relative frequency difference (defined as the difference between the anti-resonance and resonance frequencies divided by the average of the anti-resonance and resonance frequencies) of the rotated Y-cut XBAR is about 15%.

As previously described, the resonance frequencies of shunt resonators in a ladder filter circuit are typically below the lower edge of the filter passband and the anti-resonance frequencies of shunt resonators are within the passband. Conversely, the anti-resonance frequencies of series resonators are typically above the upper edge of the filter passband and the resonance frequencies of series resonators are within the passband. Consideration of the solid curve 420, which may represent either a shunt resonator or a series resonator, shows these conditions can only be satisfied if the relative frequency difference of the resonators is less than or equal to the fractional bandwidth of the communications band 410. In this example, a filter with a fraction bandwidth of 12.5% cannot be implemented using only rotated Y-cut XBARs. When the resonance frequency of a rotated Y-cut XBAR is just below the lower edge of passband, the anti-resonance frequency is at or above the upper edge of the passband. Conversely, when the anti-resonance frequency is just above the upper edge of the passband, the resonance frequency is at or below the lower edge of the passband.

As introduced in FIG. 1, a subcircuit with a capacitor in parallel with an acoustic resonator has essentially the same resonance frequency and a lower anti-resonance frequency than the acoustic resonator alone. Thus, the dashed curve 430 can be realized by a subcircuit consisting of a capacitor in parallel with the rotated Y-cut XBAR having the admittance characteristic of curve 420. The capacitance value is selected to lower the anti-resonance frequency into the passband of the filter, as required for a shunt resonator. A similar sub-circuit, with the resonance frequency of the XBAR shifted upward, can also be used to realize the dot-dash curve 440 for series resonators.

Figure 5:
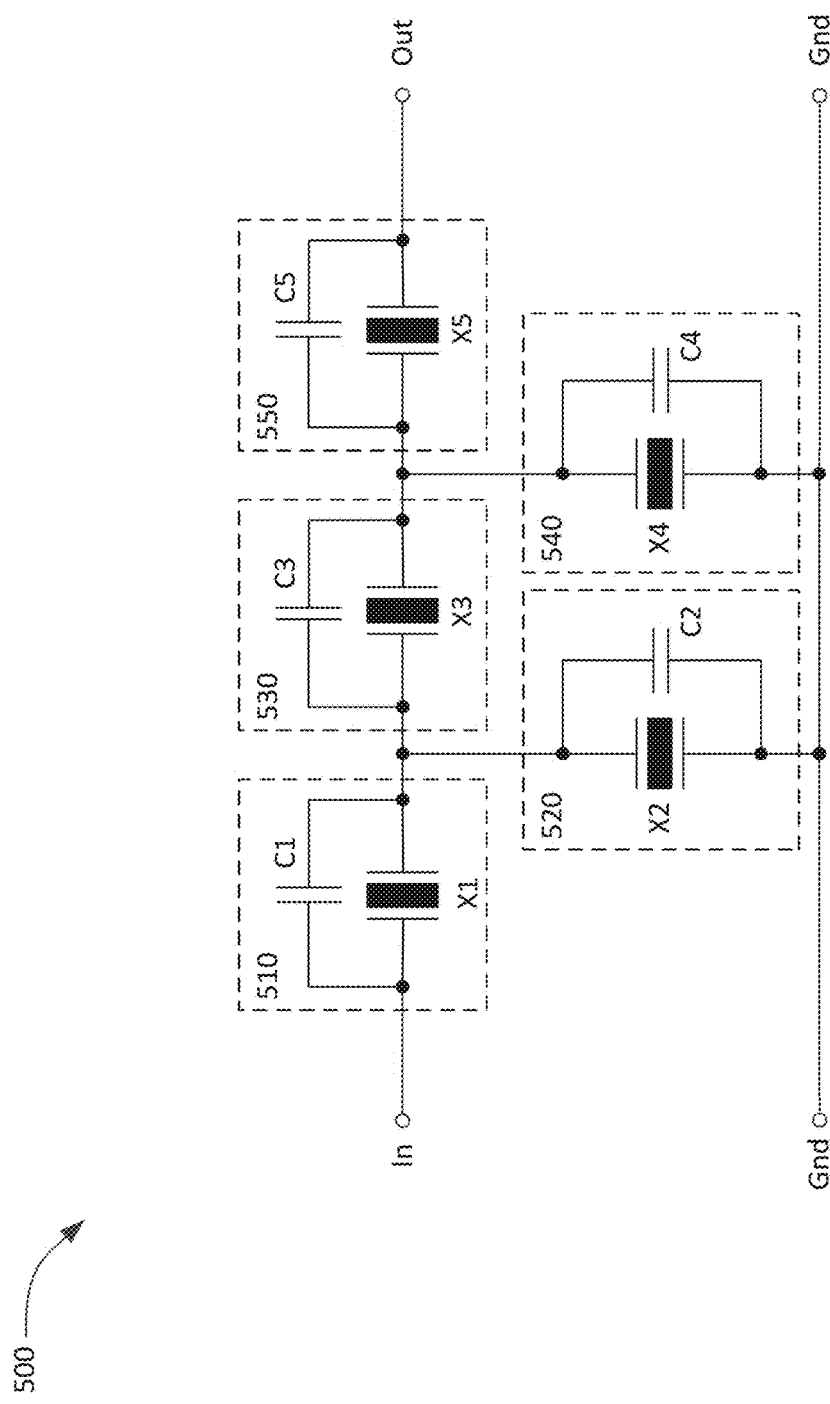
FIG. 5 is a schematic block diagram of another band-pass filter using acoustic resonators.

FIG. 5 is a schematic circuit diagram for a high frequency band-pass filter 500 implemented with acoustic resonators where a fractional bandwidth of the filter is less than a relative frequency difference of the acoustic resonators. For example, the acoustic resonators may be rotated Y-cut XBARs having a relative frequency difference of 15% or more and the fractional bandwidth of the filter may be less than or equal to 13%.

The filter 500 has a conventional ladder filter architecture including three series resonators X1, X3, X5 and two shunt resonators X2 and X4. The three series resonators X1, X3, X5 are connected in series between a first port and a second port (hence the term "series resonator"). In FIG. 5, the first and second ports are labeled "In" and "Out", respectively. However, the filter 500 is bidirectional and either port may serve as the input or output of the filter. The two shunt resonators X2, X4 are connected from nodes between the series resonators to ground. Other filter circuits may have shunt resonators connected between ground and either of the first and second ports.

Capacitors C1, C2, C3, C4, and C5 are connected in parallel with resonators X1, X2, X3, X4, and X5, respectively. The parallel resonator/capacitor pairs form five subcircuits 510, 520, 530, 540, 550, indicated by dashed rectangles. Subcircuits 510, 530, 550 are "series subcircuits" and subcircuits 520 and 540 are "shunt subcircuits". The value of each capacitor C1-C5 is selected such that the relative resonance to anti-resonance frequency difference of the corresponding subcircuit 510-550 is less than or equal to the fractional bandwidth of the filter 500. Specifically, the values of C1, C3, and C5 are selected such that the resonance frequencies of subcircuits 510, 530, and 550, respectively, fall within the passband of the filter 500 when the anti-resonance frequencies are above the passband. The values of capacitors C2 and C4 are selected such that the anti-resonance frequencies of subcircuits 520 and 540, respectively, fall within the passband of the filter 500 when the resonance frequencies are below the passband. The values of the capacitors C1 to C5 may be, for example, from 1% to about 50% of the static capacitance $C_0$ of the respective resonator.

The inclusion of three series and two shunt resonators in the filter 500 is exemplary. A filter may have more or fewer than five total resonators, more or fewer than three series resonators, more or fewer than two shunt resonators, and more or fewer than five capacitors.

Figure 6:
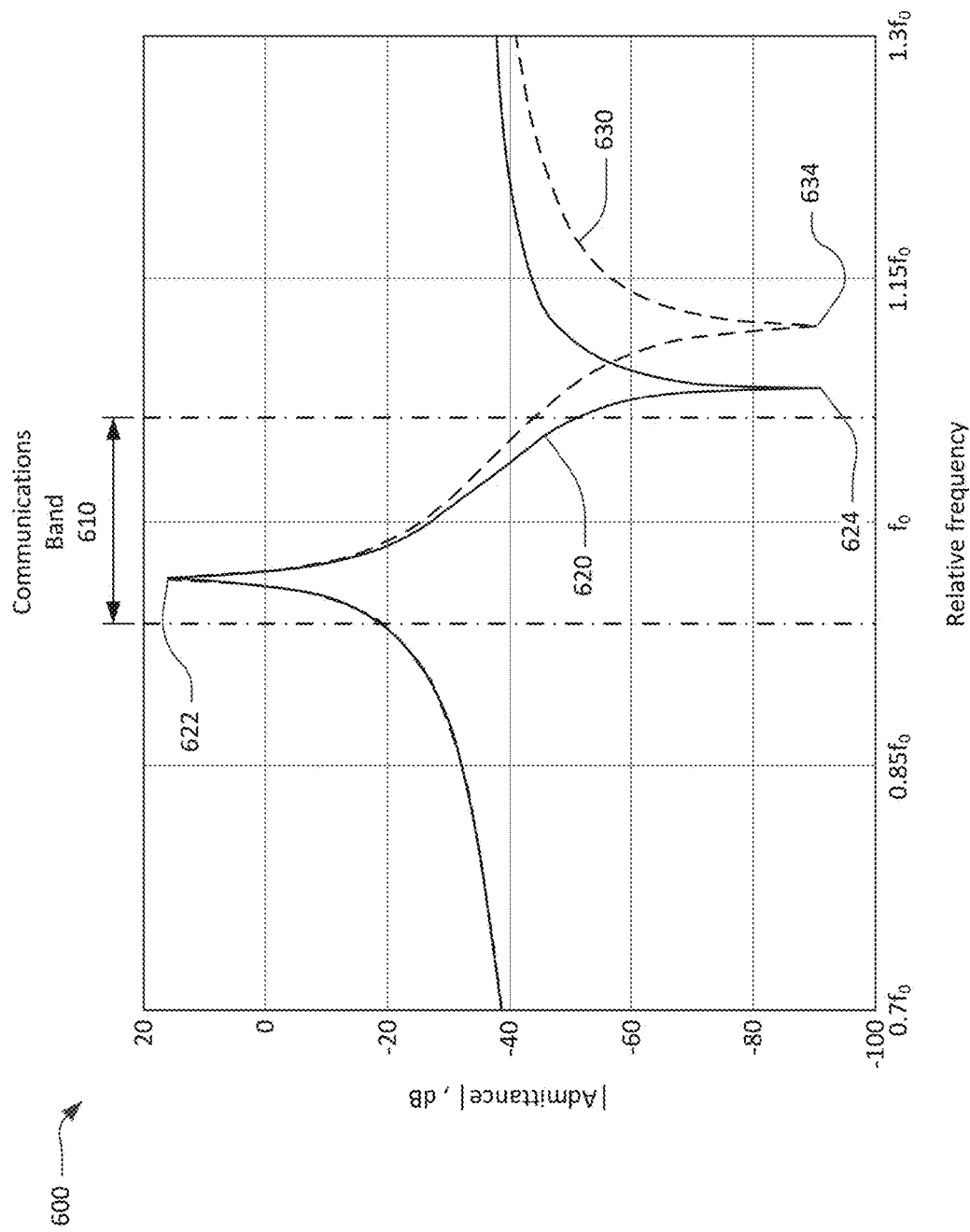
FIG. 6 is chart showing the magnitude of admittance of series resonator subcircuits relative to a target communications band.

FIG. 6 is a graph 600 of the magnitude of admittance of two series subcircuits which may be, for example, two of subcircuits 510, 530, 550 of FIG. 5. The dot-dash lines define the upper and lower edges of a communications band 610 with a fractional bandwidth of 12.5%. The solid curve 620 is a plot of the magnitude of admittance of a first series subcircuit having a resonance 622 within the communications band and an anti-resonance 624 at a frequency above and proximate the upper edge of the communications band. In this context, the term "proximate" has its conventional meaning of immediately adjoining. The difference between the upper edge of the communications band and the anti-resonance frequency 624 is determined by the Q-factor of the series subcircuit and the margin allowed for temperature variations and manufacturing tolerances.

If the resonator within the first series subcircuit has a relative frequency difference greater than the fractional bandwidth of the communications band (12.5% in this example), the value of the capacitor within the first series subcircuit is selected to set the anti-resonance of the subcircuit at the desired frequency above and proximate the upper band edge. At least one series subcircuit in a ladder filter circuit will have an anti-resonance frequency just above and proximate the upper edge of the filter band. Commonly, two or more series subcircuits in a ladder filter circuit may have the same, or nearly the same anti-resonance frequencies just above the upper band edge of the communications band.

The dashed curved 630 is a plot of the magnitude of admittance of a second series subcircuit that has a resonance at the same frequency as the resonance 622 of the first series subcircuit and an antiresonance 634 at a substantially higher frequency. A transmission zero at a frequency substantially higher than the upper edge of the communications band may be required in some filters to ensure adequate rejection at frequencies above the upper edge of the communications band. To increase the frequency of the antiresonance of the second series subcircuit, the second series subcircuit may have no capacitor in parallel with the respective resonator or a smaller capacitor than the first series subcircuit.

While the resonance frequencies of the first and second series subcircuits were the same in this example, this need not be the case. The resonance frequency of a subcircuit including a XBAR and a capacitor in parallel is determined primarily by the thickness of the diaphragm (including the piezoelectric plate and any dielectric layers) of the XBAR, with minor dependence on the pitch and mark of the IDT within the XBAR. In a typical filter, the same diaphragm thickness may be used for all series resonators and the resonance frequencies differ by not more than a few percent due to changes in pitch and mark.

Figure 7:
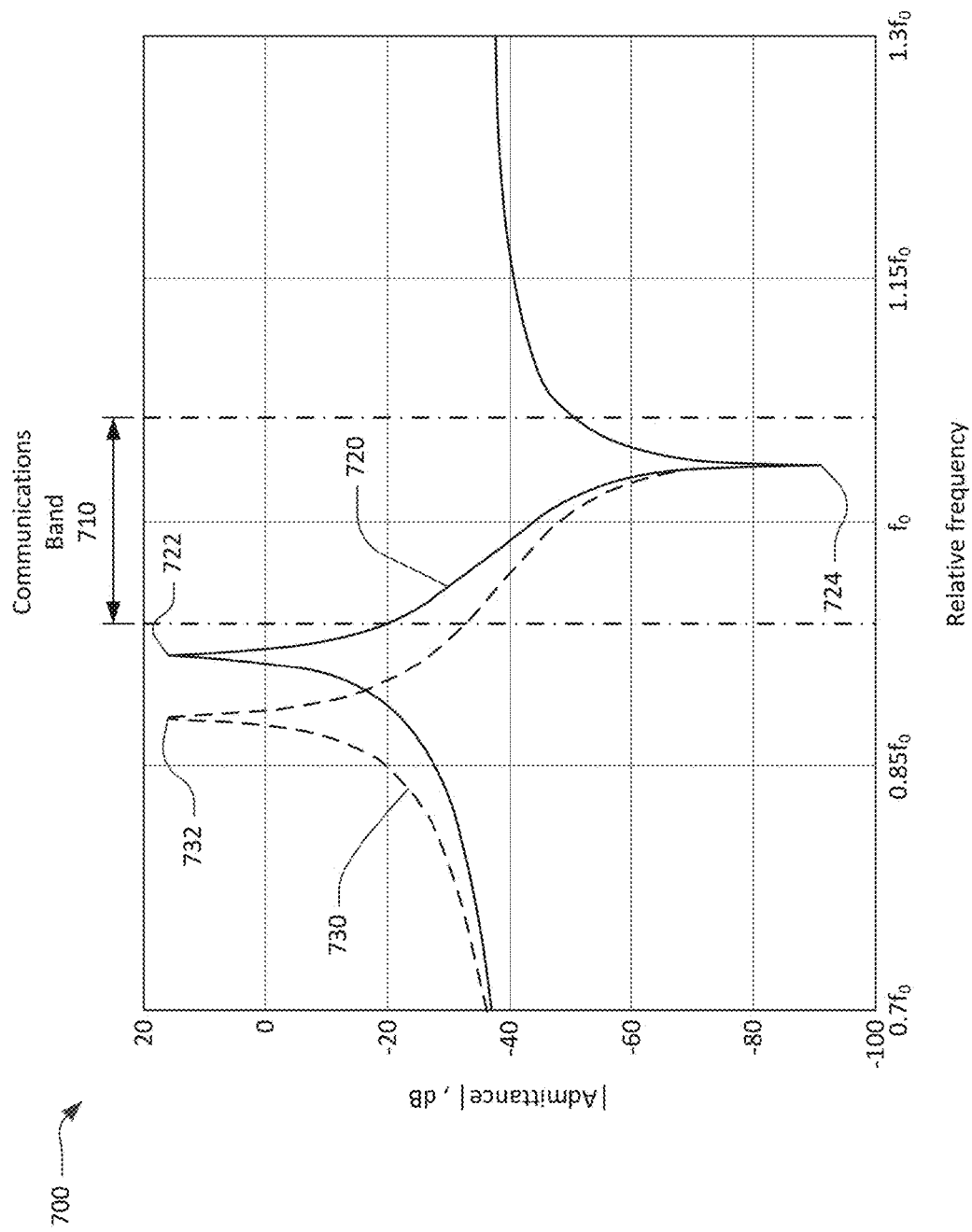
FIG. 7 is chart showing the magnitude of admittance of shunt resonator subcircuits relative to a target communications band.

FIG. 7 is a graph of the magnitude of admittance of two shunt subcircuits which may be, for example, subcircuits 520 and 540 of FIG. 5. The dot-dash lines define the upper and lower edges of a communications band 710 with a fractional bandwidth of 12.5%. The solid curve 720 is a plot of the magnitude of admittance of a first shunt subcircuit having a resonance 722 below and proximate the lower band edge the communications band and an anti-resonance 724 at a frequency within the communications band. The difference between the lower edge of the communications band and the resonance frequency 722 is determined by the Q-factor of the shunt subcircuit and the margin allowed for temperature variations and manufacturing tolerances.

If the resonator within the first shunt subcircuit has a relative frequency difference greater than the fractional bandwidth of the communications band (12.5% in this example), the value of the capacitor within the first shunt subcircuit is selected to set the anti-resonance of the subcircuit at the desired frequency within the communications band. At least one shunt resonator subcircuit will have a resonance frequency just below and proximate the lower edge of the communications band. When the relative frequency difference of the resonators is greater than the fractional bandwidth of the communications band, at least one shunt resonator subcircuit will include a capacitor. Commonly, two or more shunt subcircuits in a filter may have the same, or nearly the same resonance frequencies just below the lower band edge of the communications band.

The dashed curved 730 is a plot of the magnitude of admittance of a second shunt subcircuit that has an anti-resonance at the same frequency as the anti-resonance 724 of the first shunt subcircuit and a resonance 732 at a frequency substantially less than the resonance frequency of the first shunt subcircuit. A transmission zero at a frequency substantially lower than the lower edge of the communications band may be required in some filters to ensure adequate rejection at frequencies below the lower edge of the communications band.

While the anti-resonance frequencies of the first and second shunt subcircuits were the same in this example, this need not, and commonly may not, be the case. The resonance frequency of a subcircuit including a XBAR and a capacitor in parallel is determined primarily by the thickness of the diaphragm (including the piezoelectric plate and any dielectric layers) of the XBAR, with minor dependence on the pitch and mark of the IDT within the XBAR. To reduce the resonance 732 of the second shunt subcircuit to a frequency significantly below the resonance 722 of the first shunt subcircuit, a thickness of the diaphragm of the XBAR with the second shunt circuit may be greater than a thickness of the diaphragm of the XBAR with the first shunt circuit. For example, the thickness of the diaphragm of the XBAR within the second shunt circuit may be greater by virtue of an additional dielectric layer. Since the frequency difference between the resonance and anti-resonance of the second shunt subcircuit is larger than the frequency difference between the resonance and anti-resonance of the first shunt subcircuit, the second shunt subcircuit may include a smaller capacitor or no capacitor.

FIG. 8A shows a plan view and an enlarged cross-sectional view of a metallization pattern including the IDT 830 of an XBAR resonator in parallel with a metal-insulator-metal (MIM) capacitor 870. The IDT 830 includes a first bus bar 832, a second bus bar 834, and a plurality of interleaved fingers such as finger 838. The interleaved fingers are disposed on a diaphragm formed by a piezoelectric plate 810 spanning a cavity 845 in a substrate 820.

The metallization pattern includes a first conductor layer 852, which may be, for example, aluminum or aluminum over an underlying adhesion layer such as titanium or chrome. The first conductor layer 852 may be used for the IDT fingers and busbars of multiple XBARs and all conductors that interconnect the XBARs in a ladder filter circuit. The metallization pattern includes a second conductor layer 854 formed over the first conductor layer of the bus bars and other conductors (but not the IDT fingers) to reduce ohmic losses.

The MIM capacitor 870 may be formed by a portion of the second conductor layer 854 that overlaps a portion of the first conductor layer 852 with an intervening dielectric layer 860. The dielectric layer 860 may be specific to the MIM capacitor or may also serve another purpose, such a frequency setting layer over one or more shunt resonators.

FIG. 8B shows a plan view of a metallization pattern including the IDT 830 of an XBAR resonator in parallel with an interdigitated capacitor 880. The IDT 830 includes a first bus bar 832, a second bus bar 834, and a plurality of interleaved fingers such as finger 838. The interleaved fingers are disposed on a diaphragm formed by a piezoelectric plate (not identified) spanning a cavity 845 in a substrate (not visible).

The interdigitated capacitor 880 includes a plurality of interleaved fingers extending perpendicular to the interleaved fingers of the IDT 830. To minimize the area of the interleaved capacitor 880, a pitch of the interleaved capacitor fingers may be less than the pitch of the IDT fingers and the mark/pitch ratio of the interleaved capacitor fingers may be about 50%. When the XBAR includes a rotated Y-cut piezoelectric plate, there is little or no excitation of acoustic waves by the interleaved capacitor fingers perpendicular to the IDT fingers.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A bandpass filter for a communication band extending between a lower band edge and an upper band edge, the bandpass filter comprising:
 a plurality of transversely excited bulk acoustic resonators (XBARs) including a plurality of shunt resonators and a plurality of series resonators connected in a ladder filter circuit, wherein a relative frequency difference between anti-resonance and resonance frequencies of each transversely excited bulk acoustic resonator is greater than a fractional bandwidth of the communications band;
 a first capacitor connected in parallel with a first shunt resonator of the plurality of shunt resonators to form a first shunt subcircuit; and
 a second capacitor connected in parallel with a first series resonator of the plurality of series resonators to form a first series subcircuit,
 wherein the relative frequency difference of each of the XBARs is greater than or equal to 15%, the relative frequency difference being a difference between the resonance and the anti-resonance frequencies divided by an average of the resonance and the anti-resonance frequencies,
 wherein at least one of the first capacitor and the second capacitor is a metal-insulator-metal (MIM) capacitor,
 wherein a first conductor layer includes a portion forming interleaved fingers of an interdigital capacitor of at least one of the first and second capacitors,
 wherein a pitch between two adjacent fingers of the interleaved fingers is greater than 0.05 times a width of at least one finger of the interleaved fingers and less than 0.5 times the width of the at least one finger, and
 wherein the MIM capacitor is formed by a portion of a second conductor layer that overlaps a portion of the first conductor layer with an intervening dielectric layer therebetween.

2. The bandpass filter of claim 1,
 wherein the first capacitor has a capacitance value that is between 1% and 50% of a static capacitance of the first shunt resonator, and the second capacitor has a capacitance value that is between 1% and 50% of a static capacitance of the first series resonator.

3. The bandpass filter of claim 1, wherein:
 a resonance frequency of the first shunt resonator is less than and proximate the lower band edge, and
 a capacitance of the first capacitor is set such that an anti-resonance frequency of the parallel combination of the first capacitor and the first shunt resonator is within the target communications band.

4. The bandpass filter of claim 1, further comprising:
 one or more additional capacitors connected in parallel with respective resonators from the plurality of acoustic resonators.

5. The bandpass filter of claim 1, wherein all of the plurality of XBARs include lithium niobate piezoelectric plates with Euler angles 0°, β, 0° where 28°≤β≤38°.

6. The bandpass filter of claim 5, wherein
 a fractional bandwidth of the communications band is less than or equal to 13%, the fractional bandwidth being a difference between a frequency of the upper band edge of the bandpass filter and a frequency of the lower band edge of the bandpass filter divided by a center frequency of the bandpass filter.

7. The bandpass filter of claim 1, wherein the second shunt subcircuit has a thickness that is greater than a thickness of the first shunt subcircuit.

8. A bandpass filter for a communication band extending between a lower band edge and an upper band edge, the bandpass filter comprising:
 a plurality of transversely excited bulk acoustic resonators (XBARs) including a plurality of shunt resonators and a plurality of series resonators connected in a ladder filter circuit;
 a first capacitor connected in parallel with a first shunt resonator of the plurality of shunt resonators to form a first shunt subcircuit; and
 a second capacitor connected in parallel with a first series resonator of the plurality of series resonators to form a first series subcircuit,
 wherein a relative frequency difference of each of the XBARs is greater than or equal to 15%, the relative frequency difference being a difference between a resonance frequency and an anti-resonance frequency of the respective XBAR divided by an average of the resonance and the anti-resonance frequencies,
 wherein a first conductor layer includes a portion of at least one of the first and second capacitors,
 wherein at least one of the first capacitor and the second capacitor is a metal-insulator-metal (MIM) capacitor that is formed by a portion of a second conductor layer that overlaps a portion of the first conductor layer with an intervening dielectric layer therebetween, and
 wherein each of the XBARs includes a plurality of interleaved fingers and a pitch between two adjacent fingers of the plurality of interleaved fingers is greater than 0.05 times a width of at least one finger of the plurality of interleaved fingers and less than 0.5 times the width of the at least one finger.

9. The bandpass filter of claim 8, wherein the relative frequency difference between the anti-resonance and resonance frequencies of each transversely excited bulk acoustic resonator is greater than a fractional bandwidth of the communications band.

10. The bandpass filter of claim 8, wherein the portion of the first conductor forms interleaved fingers of an interdigital capacitor of the at least one of the first and second capacitors.

11. The bandpass filter of claim 8, wherein the first capacitor has a capacitance value that is between 1% and 50% of a static capacitance of the first shunt resonator, and the second capacitor has a capacitance value that is between 1% and 50% of a static capacitance of the first series resonator.

12. The bandpass filter of claim 8, wherein:
 a resonance frequency of the first shunt resonator is less than and proximate the lower band edge, and
 a capacitance of the first capacitor is set such that an anti-resonance frequency of the parallel combination of the first capacitor and the first shunt resonator is within the target communications band.

13. The bandpass filter of claim 8, further comprising one or more additional capacitors connected in parallel with respective resonators from the plurality of acoustic resonators.

14. The bandpass filter of claim 8, wherein all of the plurality of XBARs include lithium niobate piezoelectric plates with Euler angles 0°, β, 0° where 28°≤β≤38°.

15. The bandpass filter of claim 8, wherein:
- a fractional bandwidth of the communications band is less than or equal to 13%, the fractional bandwidth being a difference between a frequency of the upper band edge of the bandpass filter and a frequency of the lower band edge of the bandpass filter divided by a center frequency of the bandpass filter.

* * * * *